(12) United States Patent
Heid et al.

(10) Patent No.: US 9,433,135 B2
(45) Date of Patent: Aug. 30, 2016

(54) RF APPARATUS AND ACCELERATOR HAVING SUCH AN RF APPARATUS

(75) Inventors: Oliver Heid, Erlangen (DE); Timothy Hughes, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 125 days.

(21) Appl. No.: 13/877,634

(22) PCT Filed: Sep. 20, 2011

(86) PCT No.: PCT/EP2011/066265
§ 371 (c)(1),
(2), (4) Date: Apr. 3, 2013

(87) PCT Pub. No.: WO2012/045571
PCT Pub. Date: Apr. 12, 2012

(65) Prior Publication Data
US 2013/0194773 A1  Aug. 1, 2013

(30) Foreign Application Priority Data
Oct. 7, 2010 (DE) .................. 10 2010 042 149

(51) Int. Cl.
*H01P 7/06* (2006.01)
*H05K 9/00* (2006.01)
*H05H 7/02* (2006.01)
*H05H 7/18* (2006.01)
(Continued)

(52) U.S. Cl.
CPC ............ *H05K 9/00* (2013.01); *H05H 7/02* (2013.01); *H05H 7/18* (2013.01); *H05H 9/00* (2013.01); *H05H 2007/227* (2013.01)

(58) Field of Classification Search
CPC .................................................... H01P 7/06
USPC .................. 333/202–219.1, 222–229
See application file for complete search history.

(56) References Cited

U.S. PATENT DOCUMENTS

| | | | |
|---|---|---|---|
| 3,495,125 A | 2/1970 | Koontz | 333/35 |
| 3,546,633 A | 12/1970 | Peppiatt | 333/103 |
| 4,066,988 A | 1/1978 | Karp | 333/223 |

(Continued)

FOREIGN PATENT DOCUMENTS

| | | | | |
|---|---|---|---|---|
| WO | 2011/061026 A1 | 5/2011 | | H05H 7/02 |
| WO | 2012/045571 A1 | 4/2012 | | H05H 7/02 |

OTHER PUBLICATIONS

Heid, O. et al., "Compact Solid State Direct Drive RF Linac," Proceedings of IPAC '10, Kyoto, Japan, 3 pages, 2010.

(Continued)

*Primary Examiner* — Sibin Chen
*Assistant Examiner* — Metasebia Retebo
(74) *Attorney, Agent, or Firm* — Slayden Grubert Beard PLLC

(57) ABSTRACT

An RF apparatus may include: an RF resonance device having an electrically conductive outer wall, the outer wall comprising a gap extending over its circumference, and an input coupling device having an RF generator, arranged on the outer side of the outer wall of the RF resonance device in the region of the gap, for coupling RF radiation of a particular frequency through the gap into the interior of the RF resonance device, and shielding which externally shields the generator and electrically bridges the gap on the outer side of the outer wall, wherein the shielding is formed as a resonator having a high impedance at the generator frequency.

17 Claims, 3 Drawing Sheets

(51) Int. Cl.
*H05H 9/00* (2006.01)
*H05H 7/22* (2006.01)

(56) References Cited

U.S. PATENT DOCUMENTS

| | | | | |
|---|---|---|---|---|
| 4,453,139 | A | 6/1984 | Labaar | 331/47 |
| 5,497,050 | A * | 3/1996 | Cheo | H03F 3/60 |
| | | | | 315/5.41 |
| 5,661,366 | A * | 8/1997 | Hirota | H05H 9/02 |
| | | | | 313/359.1 |
| 6,002,311 | A * | 12/1999 | Wey et al. | 333/219.1 |
| 6,724,261 | B2 | 4/2004 | Cheo | 330/295 |
| 2005/0174201 | A1 * | 8/2005 | Luong | G01R 33/34046 |
| | | | | 333/219 |
| 2010/0090785 | A1 * | 4/2010 | Panariello | H01P 7/10 |
| | | | | 333/209 |
| 2012/0229054 | A1 | 9/2012 | Baurichter et al. | 315/505 |

OTHER PUBLICATIONS

German Office Action, Application No. 10 2010 042 149.9, 5 pages, Jun. 29, 2011.

International Search Report and Written Opinion, Application No. PCT/EP2011/066265, 17 pages, Jan. 24, 2012.

Japanese Office Action, Application No. 2013-532105, 5 pages, Jul. 29, 2014.

* cited by examiner

RF APPARATUS AND ACCELERATOR HAVING SUCH AN RF APPARATUS

CROSS-REFERENCE TO RELATED APPLICATIONS

This application is a U.S. National Stage Application of International Application No. PCT/EP2011/066265 filed Sep. 20, 2011, which designates the United States of America, and claims priority to DE Patent Application No. 10 2010 042 149.9 filed Oct. 7, 2010. The contents of which are hereby incorporated by reference in their entirety.

TECHNICAL FIELD

The disclosure relates to an RF apparatus having an RF cavity delimited by an outer wall, and an input coupling device which is arranged on the outer wall and has an RF generator and shielding. The RF generator couples an electromagnetic field through a gap formed in the outer wall into the interior of the RF cavity. The shielding is formed resonantly and has a high impedance at the generator frequency. Furthermore, the disclosure relates to a particle accelerator comprising at least one such RF apparatus.

BACKGROUND

RF cavities, which are used as resonators for radiofrequency electromagnetic fields, are typically hollow bodies having an electrically conductive outer wall. An RF generator arranged outside the cavity generates electromagnetic radiation with a high frequency, which is coupled through an opening in the outer wall of the cavity into the interior of the cavity. The alternating electromagnetic fields generated by the generator induce, inter alia, alternating currents which propagate along current paths present on the inner side of the outer wall. Depending on the generator frequency and the waveguide properties of the cavity, various resonant modes may be set up inside the RF cavity. Owing to the arrangement of the RF generator outside the cavity, however, currents are also induced on the outer side of the outer wall, by which the power coupled into the cavity and therefore the efficiency of the cavity may be reduced.

SUMMARY

One embodiment provides an RF apparatus comprising: an RF resonance device having an electrically conductive outer wall, the outer wall comprising a gap extending over its circumference, and an input coupling device having an RF generator, arranged on the outer side of the outer wall of the RF resonance device in the region of the gap, for coupling RF radiation of a particular generator frequency through the gap into the interior of the RF resonance device, and shielding which externally shields the generator and electrically bridges the gap on the outer side of the outer wall, wherein the shielding is formed as a resonator with a high impedance for the generator frequency.

In a further embodiment, the shielding is tuned to a resonant frequency different to the generator frequency.

In a further embodiment, the shielding is tuned to a resonant frequency above the generator frequency.

In a further embodiment, the capacitive and inductive properties of the shielding are adapted so that a standing electromagnetic wave having a current node in the region of the gap is formed in the shielding at the generator frequency.

In a further embodiment, the electrical length of the shielding corresponds essentially to one fourth of the wavelength $\lambda$ of the electromagnetic wave generated by the generator.

In a further embodiment, the RF resonance device is formed as an RF cavity.

In a further embodiment, the RF resonance device is formed as a waveguide.

In a further embodiment, the RF resonance device is formed as a coaxial conductive connection.

In a further embodiment, the generator comprises a plurality of transistor modules distributed over the circumference of the RF resonance device.

In a further embodiment, the gap is delimited by two opposite flanges of the outer wall of the RF resonance device, and wherein the transistor modules are respectively arranged in recesses inside the two flanges.

Another embodiment provides a particle accelerator comprising at least one RF apparatus as disclosed above.

In a further embodiment, the particle accelerator comprises at least two RF cavities connected in series.

BRIEF DESCRIPTION OF THE DRAWINGS

Exemplary embodiments will be explained in more detail below on the basis of the schematic drawings, wherein.

DETAILED DESCRIPTION

Figure 1:
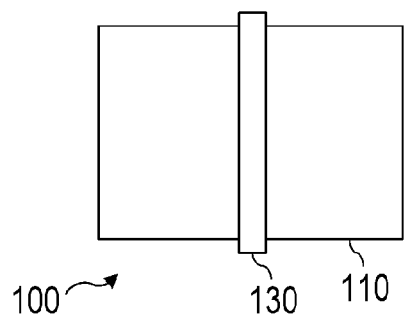
FIGS. 1 and 2 schematically show a cylindrical RF cavity having an input coupling device arranged over its circumference for coupling RF radiation into the RF cavity.

Embodiments of the present disclosure provide an RF apparatus and a particle accelerator that provide improved or even maximally effective coupling of RF radiation into an RF cavity as compared with certain conventional techniques.

Some embodiments provide an RF apparatus comprising an RF resonance device having an electrically conductive outer wall, the outer wall comprising a gap extending over its circumference. The RF apparatus furthermore comprises an input coupling device having an RF generator, arranged on the outer side of the outer wall of the RF resonance device in the region of the gap, for coupling RF radiation of a particular frequency through the gap into the interior of the RF resonance device, and having shielding which externally shields the generator and electrically bridges the gap on the outer side of the outer wall. The shielding is formed as a resonator with a high impedance for the frequency of the generator. The effect of the high impedance is that little current flows through the shielding. Configuring the shielding in the form of a resonator particularly straightforwardly permits a high impedance and therefore very efficient coupling of the RF radiation into the resonance device. Since no RF currents are set up on the outer side of the cavity because of the shielding, use of the RF apparatus is more reliable overall. Furthermore, an RF cavity maintained at ground potential can be combined more compatibly with other apparatuses.

According to one embodiment, the resonantly formed shielding has a resonant frequency different to the generator frequency. In this way, the characteristic impedance, and therefore the behavior of the resonant shielding during operation, can be adjusted as desired according to the application.

According to another embodiment, the shielding is tuned to a resonant frequency above the generator frequency. In this way, the setting up of a resonant mode with a low impedance at the generator frequency in the shielding formed as a resonator is prevented in an effective way.

According to another embodiment, the capacitive and inductive properties of the shielding are adapted so that a standing electromagnetic wave having a current node in the region of the gap is formed in the shielding at the generator frequency. An increased or even maximized input impedance of the shielding may thereby be achieved.

According to another embodiment, the electrical length of the shielding corresponds essentially to one fourth of the wavelength of the electromagnetic wave generated by the generator. This electrical length represents a particularly favorable embodiment since the tuning of the shielding is simplest in this case.

According to another embodiment, the RF resonance device is formed as an RF cavity. Owing to their high quality, RF cavities are particularly suitable for the generation of resonant electromagnetic waves.

According to another embodiment, the RF resonance device is formed as a coaxial conductive connection. Such coaxial waveguides can be used particularly flexibly.

According to another embodiment, the generator comprises a plurality of transistor modules distributed over the circumference of the RF resonance device. With the aid of such transistor modules, electromagnetic fields can be generated directly on the resonance device. This allows particularly effective input coupling of electromagnetic radiation.

According to another embodiment, the gap is delimited by two opposite flanges of the outer wall of the RF resonance device, wherein the transistor modules are respectively arranged in recesses inside the two flanges. This specific arrangement of the transistor modules allows particularly effective input coupling of alternating currents into the resonance device.

Other embodiments provide a particle accelerator comprising at least one corresponding RF apparatus. Particularly strong electromagnetic fields can be generated with the aid of such a particle accelerator.

According to one embodiment, the particle accelerator comprises a plurality of RF cavities connected in series. By virtue of the interconnection of the RF cavities, the strength of the electromagnetic fields generated can be increased particularly simply.

FIG. 1 shows a side view of an RF apparatus 100 according to one embodiment. The apparatus 100 comprises a cylindrical RF cavity 110 having a metallic outer wall, which is used as a resonance device for RF radiation of a particular frequency. An input coupling device 130 for coupling RF power into the RF cavity 110 is arranged over the circumference of the RF cavity 110.

Figure 2:
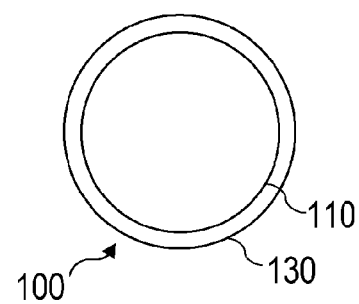

FIG. 2 represents the RF apparatus 100 of FIG. 1 in a front view. Here, it can be seen that the input coupling device 130 extends over the entire circumference of the RF cavity 110. Depending on the application, the input coupling device 130 may also extend only over a part of the circumference of the RF cavity 110. A plurality of such input coupling devices 130, extending only over a part of the circumference, i.e. only over portions, may furthermore be arranged over the circumference of the RF cavity 110.

The input coupling device 130 will be explained in more detail below with the aid of cross sections. To this end, FIG. 3 shows a longitudinal section and FIG. 4 shows a cross section of the RF apparatus 100 according to the embodiment shown in FIG. 1.

Figure 3:
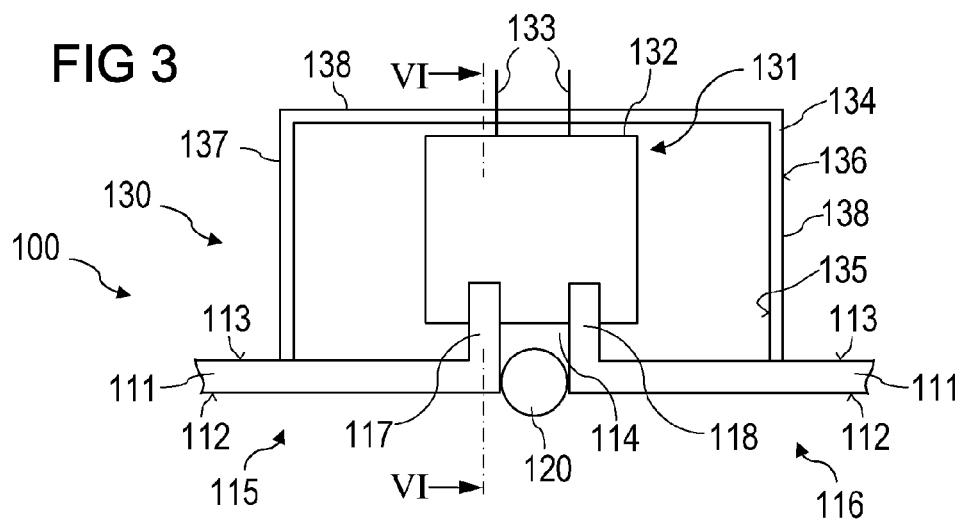
FIG. 3 shows a longitudinal section through the RF cavity of FIG. 1 with a detailed representation of the input coupling device.
Figure 4:
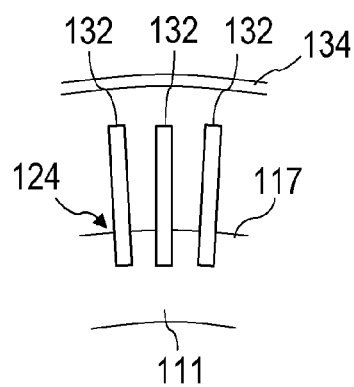
FIG. 4 shows a cross section through the RF apparatus shown in FIG. 3, along the line IV-IV.

As shown in FIG. 3, the metallic outer wall 111 of the RF cavity 110 has a gap 114 extending over the circumference of the RF cavity 110 in the region of the input coupling device 130. In the following example, the gap 114 divides the outer wall 111 into a first wall section 115 and a second wall section 116. Insulation 120 comprising of an electrically nonconductive material is arranged inside the gap 114. In addition, the annular insulation 120 may simultaneously form a vacuum seal. The ends of the two wall sections 115, 116 are respectively configured in the form of a flange 117, 118.

The input coupling device 130 arranged on the outer side 113 of the cavity outer wall 111 comprises a generator 131, arranged in the region of the gap 114, and metallic shielding 134 which fully encloses the generator. The generator 131, configured for generating RF radiation of a particular frequency $f_G$, may comprise a plurality of transistor modules 132 distributed over the circumference. The individual transistor modules 132 are arranged in special recesses in the two flanges 117, 118 and are therefore in direct contact with those of the outer wall 111. This arrangement permits a higher RF power since, on the one hand, the area for input coupling of the RF radiation is relatively large and, on the other hand, the generation of RF radiation takes place directly where the power is required.

As shown in FIG. 3, the transistor modules 132 are connected via connecting lines 133 to a DC current source or control device (not shown here). When activated, the solid-state transistors of the modules 132 generate alternating electromagnetic fields, which in turn induce alternating currents propagating along the outer wall 111. Because of the high frequency, the alternating currents are set up only in relatively thin boundary layers on the inner and outer sides of the metallic outer wall 111. So that the induced alternating currents propagate as much as possible along the inner side 112 of the RF cavity 110, the impedance of the RF path on the outer side 113 of the cavity 110 should be maximized. This is achieved by the specially configured shielding 134 and the gap 114, which forms a high impedance at the resonant frequency of the RF cavity 110. By way of example, the use of ribbed shielding brings about a high impedance of the RF path on the outer side 113 of the cavity 110, such that the currents are forced to flow on the inner side.

In order to prevent propagation of the RF currents along the outer side 113 of the outer wall 111, the shielding 134 is electrically connected to the outer wall 111. As represented in FIG. 3, the metallic shielding 134 electrically bridges the gap 114 and thus constitutes a short circuit between the two wall sections 115, 116. Since the induced alternating currents are set up only in the boundary layer of the outer wall 111, while the inner region of the metallic outer wall 111 is essentially free of currents and fields, the short circuit produced by the shielding merely affects the alternating current propagating along the outer side 113 of the cavity outer wall 111. The currents induced on the outer side 113 of the cavity outer wall 111 thus propagate along the inner side 135 of the metal sheets 136, 137, 138 forming the shielding 134, while the cavity outer wall 111 outside the shielding 134 has virtually no currents or voltage. In order to optimize the coupling of the RF currents into the interior of the RF cavity 110, the shielding 134 is formed resonantly. To this end, the transmission properties of the input coupling device 130 are adapted so that there is an increased or even maximized impedance in the region of the gap 114 for the alternating currents propagating inside the shielding 134.

FIG. 4 shows a cross section along the line IV-IV through the RF cavity 100 shown in FIG. 3. It can be seen therefrom that the transistor modules 132 arranged over the circumference of the outer wall 111 of the cavity 110 are fitted in corresponding recesses of the flanges 117, 118.

Figure 5:
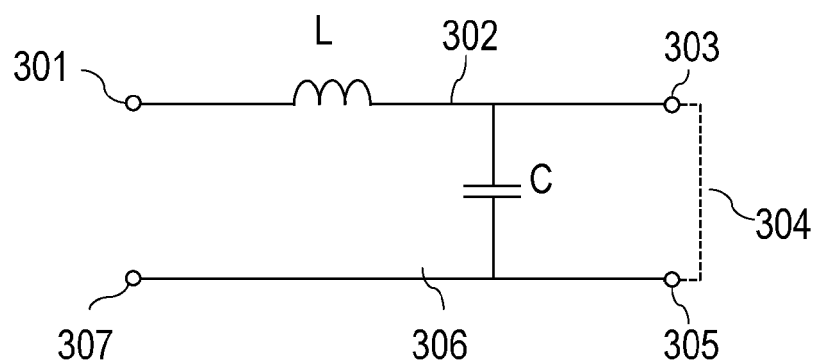
FIG. 5 shows a simplified model representation of the shielding used for the RF radiation as a waveguide.

FIG. 5 shows a highly simplified equivalent circuit diagram of the shielding 134. Here, the shielding 134 is regarded as a short-circuited transmission line. In this case, the two terminals 131, 137 on the left correspond to the input feed points of the RF radiation in the region of the gap. The upper and lower two line sections 302, 306, on the other hand, correspond to the two essentially symmetrical current paths of the alternating currents considered here along the inner side 135 of the shielding 134. The upper line section 302 is formed essentially by the left-hand side wall 136 of the shielding 134, the part of the first outer wall section 115 arranged inside the shielding 134 and a part of the upper cover wall 137 of the shielding. In a similar way, the lower line section 306 in the equivalent circuit diagram 300 shown here is formed by the right-hand side wall 136 of the shielding 134, the part of the second outer wall section 116 arranged inside the shielding 134 and a part of the upper cover wall 137 of the shielding 134. The capacitance C is determined essentially by the capacitive properties of the input coupling apparatus 130, which depend both on the geometry of the shielding 134, for example made of copper, and on the material properties of the spatial volume enclosed by the shielding 134. On the other hand, the inductance L shown in the equivalent circuit diagram depends inter alia on the electrical length, which in turn depends on various factors, for example the geometrical length. The overall inductance is determined by the inductances of the individual sections of the path distances covered by the current. As is furthermore indicated in FIG. 5 by the dashed line 304, the equivalent circuit 300 represented here is short circuited on the output side since the two line portions, which are symmetrical in the present case, are electrically connected to one another by the cover element 138 of the shielding 134. Here, the ratio of the electrical length of the short-circuited line to the wavelength $\lambda$ of the RF radiation generated by the generator 131 determines whether the U-shaped line behaves as a capacitor, an inductor or tuned circuit. In the special case that the electrical length is one fourth of the wavelength $\lambda$ of current waves propagating on the inner side of the shielding 134, the circuit forms a parallel tuned circuit with the resonant wavelengths $\lambda$, $\lambda/3$, $\lambda/5$ etc. With shielding 134 correspondingly tuned to one fourth of the wavelength $\lambda$, a current node is therefore set up in the region of the gap 114 for the current component of the electromagnetic wave. In the case of resonance, the input impedance of the resonant circuit formed by the shielding tends to infinity, so that the RF power dissipated by the generator is coupled almost completely into the RF cavity that has a minimized impedance. However, the electrical length of the shielding need not be tuned optimally to $\lambda/4$. Depending on the application, it may be sufficient merely for the input impedance of the tuned circuit formed by the shielding to be much higher than the input impedance of the RF cavity. In this case as well, the induced current propagates predominantly on the inner side 112 of the outer wall 111. Optimal coupling of the RF power into the RF cavity can therefore be achieved.

Figure 6:
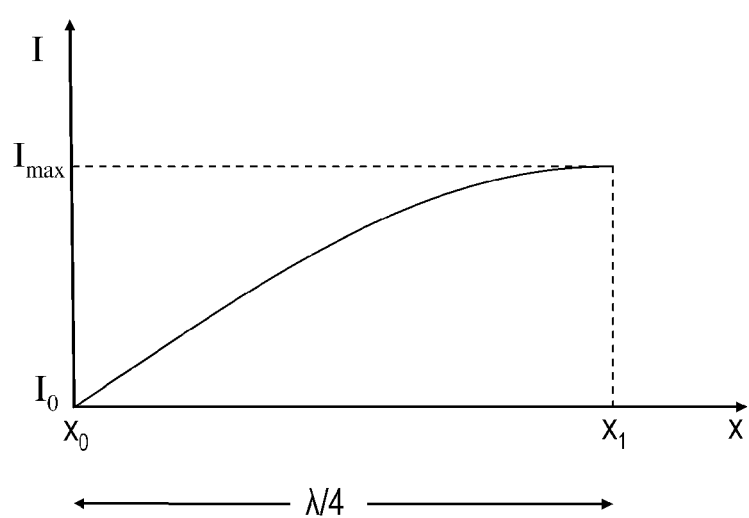
FIG. 6 shows a current distribution diagram to illustrate the current strengths occurring along the shielding formed as a $\lambda/4$ line with a current node lying in the region of the gap.

For illustration, FIG. 6 shows the current profile along the $\lambda/4$ line formed by the shielding 134. Here, it can be seen that the current strength varies sinusoidally with a minimum of the input ($x_0$) and a maximum at the end ($x_1$) of the line.

Figure 7:
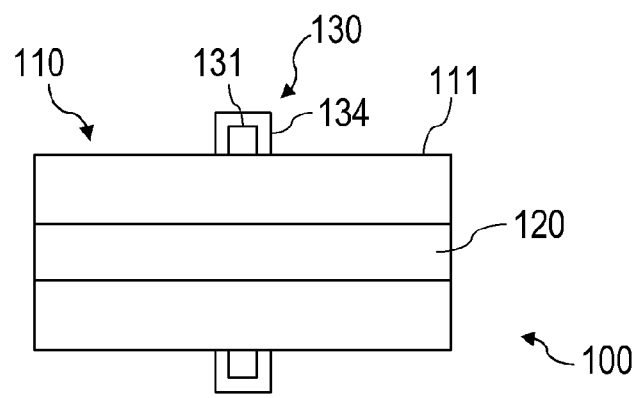
FIG. 7 shows an RF apparatus having an RF resonance device formed as a coaxial line.

The concept presented here may in principle be applied to all RF cavities as well as to other resonant waveguide structures, for example a coaxial line or a re-entrant cavity. For instance, FIG. 7 shows an RF apparatus in which the input coupling device 130 previously explained in relation to an RF cavity is used to couple electrical energy onto a coaxially conducting connection. As shown in FIG. 7, the generator 131 and the shielding 134 which encloses the generator extend over the outer circumference of the outer conductor 111 of the coaxial connection 110. In the sectional representation shown here, the inner conductor 120 typical of coaxial connections is likewise illustrated.

Figure 8:
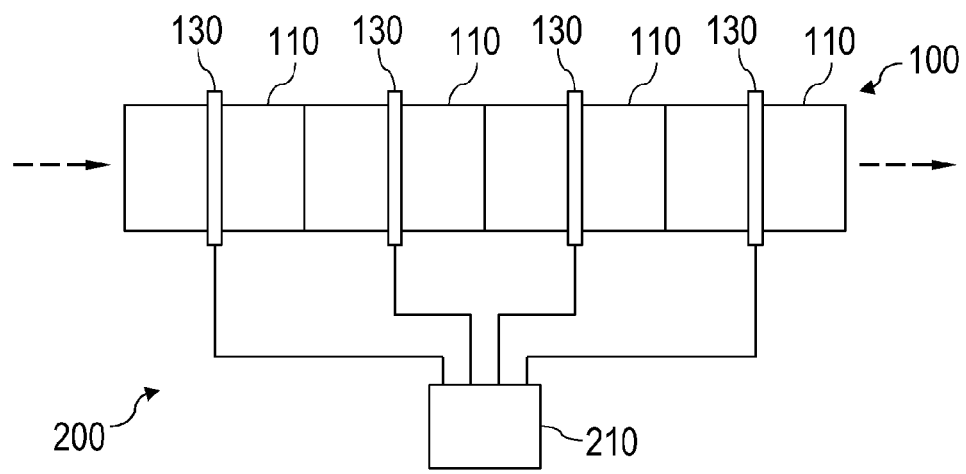
FIG. 8 shows a particle accelerator produced by interconnection of a plurality of RF cavities.

In order to achieve higher RF powers, a plurality of the RF cavities shown in FIGS. 1 to 4 may be connected in series. In this respect, FIG. 8 shows a series connection of a total of four RF cavities 100. The arrangement 200 thus formed serves as a particle accelerator in the following exemplary embodiment. The individual cavities 110 may in this case be controlled separately. To this end, the input coupling devices 130 of the four RF cavities 100 are coupled via separate lines to a common control or voltage supply device 210. Since the wall currents can propagate only along the inner side of the cavity walls, the cavities 110 connected together are decoupled in RF terms on the outer side. They can therefore be controlled independently of one another despite the DC connection.

The invention is not restricted just to the embodiments presented here by way of example. Rather, the inventive concept may be applied to any suitable RF structure in which wall currents are intended to be coupled into the interior and externally shielded.

What is claimed is:

1. An RF apparatus comprising:
   an RF resonance device having an electrically conductive cylindrical outer wall defining a cylindrical RF cavity, the cylindrical outer wall having a first circumferential wall section with a first flange extending therefrom and a second circumferential wall section with a second flange extending therefrom, wherein the first and second flanges extending from the first and second cylindrical outer walls are separated from each other by a gap extending around a circumference of the outer wall, and
   an input coupling device for coupling RF power into the RF cavity comprising:
      an RF generator arranged on an outer side of the outer wall of the RF resonance device in a region of the gap, the RF generator coupling RF radiation of a particular generator frequency through the gap into an interior of the RF resonance device, and
      shielding configured to externally shield the generator and electrically bridge the gap on the outer side of the outer wall,
      wherein the shielding is formed as a resonator with a high impedance for the particular generator frequency, and
      wherein the generator comprises a plurality of transistor modules distributed around the circumference of the RF resonance device, wherein each transistor module is (a) physically coupled to the first and second flanges of the first and second circumferential wall sections and (b) extends completely across the gap in a longitudinal direction.

2. The RF apparatus of claim 1, wherein the shielding is tuned to a resonant frequency different to the generator frequency.

3. The RF apparatus of claim 1, wherein the shielding is tuned to a resonant frequency above the generator frequency.

4. The RF apparatus of claim 1, wherein the capacitive and inductive properties of the shielding are adapted so that a standing electromagnetic wave having a current node in the region of the gap is formed in the shielding at the generator frequency.

5. The RF apparatus of claim 1, wherein the electrical length of the shielding corresponds essentially to one fourth of the wavelength $\lambda$ of the electromagnetic wave generated by the generator.

6. The RF apparatus of claim 1, wherein the RF resonance device is formed as an RF cavity.

7. The RF apparatus of claim 1, wherein the RF resonance device is formed as a waveguide.

8. The RF apparatus of claim 1, wherein the RF resonance device is formed as a coaxial conductive connection.

9. A particle accelerator comprising:
at least one RF apparatus, each comprising:
an RF resonance device having an electrically conductive cylindrical outer wall defining a cylindrical RF cavity, the cylindrical outer wall having a first circumferential wall section with a first flange extending therefrom and a second circumferential wall section with a second flange extending therefrom, wherein the first and second flanges extending from the first and second cylindrical outer walls are separated from each other by a gap extending around a circumference of the outer wall, and
an input coupling device for coupling RF power into the RF cavity comprising:
an RF generator arranged on an outer side of the outer wall of the RF resonance device in a region of the gap, the RF generator coupling RF radiation of a particular generator frequency through the gap into an interior of the RF resonance device, and
shielding configured to externally shield the generator and electrically bridge the gap on the outer side of the outer wall,
wherein the shielding is formed as a resonator with a high impedance for the particular generator frequency, and
wherein the generator comprises a plurality of transistor modules distributed around the circumference of the RF resonance device, wherein each transistor module is (a) physically coupled to the first and second flanges of the first and second circumferential wall sections and (b) extends completely across the gap in a longitudinal direction.

10. The particle accelerator of claim 9, wherein the particle accelerator comprises at least two RF cavities connected in series.

11. The particle accelerator of claim 9, wherein the shielding is tuned to a resonant frequency different to the generator frequency.

12. The particle accelerator of claim 9, wherein the shielding is tuned to a resonant frequency above the generator frequency.

13. The particle accelerator of claim 9, wherein the capacitive and inductive properties of the shielding are adapted so that a standing electromagnetic wave having a current node in the region of the gap is formed in the shielding at the generator frequency.

14. The particle accelerator of claim 9, wherein the electrical length of the shielding corresponds essentially to one fourth of the wavelength $\lambda$ of the electromagnetic wave generated by the generator.

15. The particle accelerator of claim 9, wherein the RF resonance device is formed as an RF cavity.

16. The particle accelerator of claim 9, wherein the RF resonance device is formed as a waveguide.

17. The particle accelerator of claim 9, wherein the RF resonance device is formed as a coaxial conductive connection.

* * * * *